United States Patent [19]
Zeiger

[11] Patent Number: 5,180,982
[45] Date of Patent: Jan. 19, 1993

[54] PROBEHEAD FOR A NUCLEAR MAGNETIC RESONANCE SPECTROMETER

[75] Inventor: Heinz Zeiger, Waldbronn, Fed. Rep. of Germany

[73] Assignee: Bruker Analytische Messtechnik GmbH, Fed. Rep. of Germany

[21] Appl. No.: 710,563

[22] Filed: Jun. 5, 1991

[30] Foreign Application Priority Data

Jun. 11, 1990 [DE] Fed. Rep. of Germany ....... 4018657

[51] Int. Cl.[5] ............................................ G01R 33/20
[52] U.S. Cl. .................................... 324/322; 324/318
[58] Field of Search ............... 324/300, 307, 309, 318, 324/322

[56] References Cited

U.S. PATENT DOCUMENTS

| | | | |
|---|---|---|---|
| 4,180,769 | 12/1979 | Gang | 324/319 |
| 4,633,181 | 12/1986 | Murphy-Boesch | 324/322 |
| 4,725,780 | 2/1988 | Yoda et al. | 324/318 |
| 4,784,146 | 11/1988 | Mancuso et al. | 128/653 |
| 4,851,780 | 7/1989 | Dejon et al. | 324/322 |
| 5,103,175 | 4/1992 | Kimmich et al. | 324/309 |

OTHER PUBLICATIONS

Journal of Magnetic Resonance 59, 307–317 (1984) NMR Coils with Segments in Parallel to Higher Frequencies or Lager Sample Volumes—Stephen B. W. Roeder.

Journal of Magnetic Resonance 26, 447–451 (1979) An Efficient Decoupler Coil Design which Reduces Heating in Conductive Samples in Superconduction Spectrometers, D. W. Alderman, D. M. Grant.

University diploma thesis entitled "Multipuls–Kernresonanz–Spektroskopie in Festörpern bei 270 MHz" of H. Post, public at Max–Planck–Institut für medizinische Forschung, Heidelberg, Federal Republic of Germany, 1976.

Primary Examiner—Michael J. Tokar
Attorney, Agent, or Firm—Rosenblum, Parish & Issacs

[57] ABSTRACT

A probehead for a nuclear magnetic resonance spectrometer is disclosed comprising a coil structure defining an axis and having a first, a second, and a third solenoid sub-coil. The sub-coils are switched in parallel and are fed from a common high-frequency source. Adjacent sub-coils are wound in an opposite winding direction. A sample holder is arranged within the center of the middle sub-coil.

12 Claims, 2 Drawing Sheets

PROBEHEAD FOR A NUCLEAR MAGNETIC RESONANCE SPECTROMETER

BACKGROUND OF THE INVENTION

This invention relates generally to nuclear magnetic resonance spectrometers, and, more particular, to probeheads for nuclear magnetic resonance spectrometers.

In nuclear magnetic resonance spectrometers, it is generally known to place a probehead into a strong and homogeneous constant magnetic field. The probehead consists of one or more high-frequency coils generating a high-frequency magnetic field and irradiating same on a sample being enclosed by the probehead. Within the sample region, the high-frequency magnetic field is oriented perpendicularly to the homogeneous constant magnetic field.

U.S. Pat. No. 4,851,780 describes a probehead for a nuclear magnetic resonance spectrometer, comprising two high-frequency coils being switched in parallel and being fed simultaneously from a common high-frequency transmitter/receiver. The high-frequency coils are designed as saddle-coils and are arranged adjacent to each other along a common axis. The coils are fed via electrical lines being arranged between coil terminals and a high-frequency terminal on the one hand and a ground terminal, respectively, on the other hand, both electrical lines comprising matching capacitors.

However, as is generally known, saddle-coils can only be used in a symmetric arrangement, i.e. only an even number of coils may be used as a probehead coil structure. Moreover, when two saddle-coils are used in symmetric arrangement as a high-frequency coil in a nuclear magnetic resonance probehead, and a sample is inserted along the symmetric center line extending perpendicularly to the afore-mentioned axis, the sample is located at the maximum of high-frequency electric field which gives rise to dielectric losses and, hence, decreases the probehead quality factor.

In a university diploma thesis entitled "Multipuls-Dernresonanz-Spektroskopie in Festkörpern bei 270 MHz" of Post, H., as being available to the public at Max-Planck-Institut für medizinische Forschung, Heidelberg, Federal Republic of Germany, 1976, a particular probehead is described that can be used in a nuclear magnetic resonance spectrometer having a super-conducting magnet. The probehead comprises a coil structure for irradiating the high-frequency magnetic field, the coil structure consisting of two almost identical coils being wound in opposite winding senses. The high-frequency voltage is fed to a central connection point of the coils whereas the two outer coil terminals are electrically connected to a common point.

Considering these prior art probeheads, the high-frequency magnetic field homogeneity may be increased, because the prior art probeheads having two oppositely wound sub-coils allow to use a winding number being four times as high as that of prior art coil structures having an integral spiral-shaped coil and having the same value of a series capacitor within a probehead tank circuit.

In an article published in "Journal of Magnetic Resonance", 59, pages 307 through 317 (1984), another probehead for a nuclear magnetic resonance spectrometer is described which comprises several sub-coils for a coil structure generating the high-frequency magnetic field. According to this article, the sub-coils may either be wound in the same winding sense or in opposite winding senses. In any case, the sub-coils are switched in parallel. Moreover, the article suggests to use more than two sub-coils arranged in parallel without, however, giving further details thereon.

U.S. Pat. No. 4,633,181 described a conventional integrally wound coil within a nuclear magnetic resonance spectrometer probehead, and having an adjustable capacitor in parallel to the coil. Moreover, two electric lines being connected to the coil terminals are each provided with further capacitors. In such a way, one can select higher capacitance values for each of the single capacitors. Therefore, the selected capacitors may better be realized in practice, because higher capacitance values distinguish more over ambient strayfield capacitances.

A similar arrangement is also known form an article of "Journal of Magnetic Resonance", 36, pages 447 through 451 (1979) in connection with nuclear magnetic resonance spectrometer probeheads.

However, as mentioned above, all of these prior art coil structures as used for nuclear magnetic resonance spectrometer probeheads have the common disadvantage that either relatively low capacitance values capacitors are used or we have an inhomogeneous high-frequency magnetic field, or one has the sample arranged at a point with maximum high-frequency electrical field and, therefore, considerable dielectric losses.

There is, therefore, a need for an improved probehead of this kind that avoids the drawbacks, explained before, without, however, giving up the advantages of prior art probehead structures. The present invention fulfills this need, and further provides related advantages.

SUMMARY OF THE INVENTION

The present invention resides in a probehead for a nuclear magnetic resonance spectrometer, comprising:
  a coil structure defining a first axis and having
    a first solenoid coil having a first terminal and a second terminal, and being wound in a first winding sense about said first axis;
    a second solenoid coil adjacent said first solenoid coil and having a third terminal and a fourth terminal, and being wound in a second winding sense opposite said first winding sense about said first axis, said third terminal of said second solenoid coil being connected to said second terminal of said first solenoid coil in a first junction point, said second solenoid coil being, further, arranged symmetrically with respect to a central point on said first axis;
    a third solenoid coil adjacent said second solenoid coil and having a fifth terminal and a sixth terminal, and being wound in said first winding sense about said first axis, said fifth terminal of said third solenoid coil being connected to said fourth terminal of said second coil in a second junction point;
  high-frequency signal supply means having a high-frequency terminal and a ground terminal;
  a first capacitor;
  a first electrical line interconnecting said high-frequency terminal with a first electrode of said first capacitor;

a second electrical line interconnecting said first terminal of said first solenoid coil with a second electrode of said first capacitor;
a third electrical line interconnecting said first terminal of said first solenoid coil with said second junction point between said second and said third solenoid coils;
a second capacitor;
a fourth electrical line interconnecting said ground terminal with a first electrode of said second capacitor;
a fifth electrical line interconnecting said sixth terminal of said third solenoid coil with a second electrode of said second capacitor;
a sixth electrical line interconnecting said sixth terminal of said third solenoid coil with said first junction point between said first and said second solenoid coils;
sample supporting means arranged at said central point within said second solenoid coil.

The invention has, therefore, the advantage that the geometric coil center within the second solenoid coil is selected, the high-frequency electric field having a zero transition at this point could that the area therearound is generally referred to as "cold". The dielectric losses within the sample and, therefore, the decrease in quality factor can, hence, be reduced to a minimum.

Moreover, in such a case it is possible to arrange the sample supporting structure in an electrically "cold" area, thus avoiding the risk of electrical discharges, etc., as frequently occur in electrically "hot" surroundings where high voltages are present between adjacent electrically conductive surfaces. This advantage becomes even more important when, according to a preferred embodiment of the invention, the sample support structure is arranged for allowing sample rotation, be it about the common axis of the coils or around an axis extending perpendicularly thereto or around an axis tilted with respect to the direction of the homogeneous magnetic field by the so-called "magic angle". The complex mechanical elements being necessary for allowing sample rotations may, of course, be operated safely, the more as only low high-frequency voltages are present at the location of the sample holder.

According to a preferred embodiment of the invention, the capacitors may be made adjustable.

In such a way, it is possible to either provide a fine tuning of the resonance frequency or a matching of the transmitter/receiver or to care for symmetry of the circuit.

According to another preferred embodiment of the invention, the probehead coils are designed such that their pitch varies over the common coil structure axis. If this is made properly, the decrease in high-frequency field intensity in the area of the coil terminals may be compensated for.

According to still another embodiment of the invention, the coils and the sample may be displaced along a direction extending perpendicularly to their axis.

These features have the advantage that imaging processes may be performed easily. When making solid state imaging measurements, one can, e.g., establish strong magnetic field gradients along the direction of the constant magnetic field in order to generate a defined non-homogeneous field. By displacing the sample and the sample head in the direction of the constant magnetic field, one can, therefore, make a slice selection.

It goes without saying that the probehead of this invention may be used in a constant magnetic field having superimposed linear or other magnetic field gradients, as is conventional in imaging processes for nuclear magnetic resonance tomography or for localized measurements. When doing so, the sample or the sample together with the sample head may be rotated about the direction of the constant magnetic field or about other axes or may be displaced along one of these axes.

Other features and advantage of the present invention will become apparent from the following more detailed description, taken in conjunction with the accompanying drawings, which illustrate, by way of example, the principles of the invention.

DETAILED DESCRIPTION OF THE PREFERRED EMBODIMENT

Figure 1:
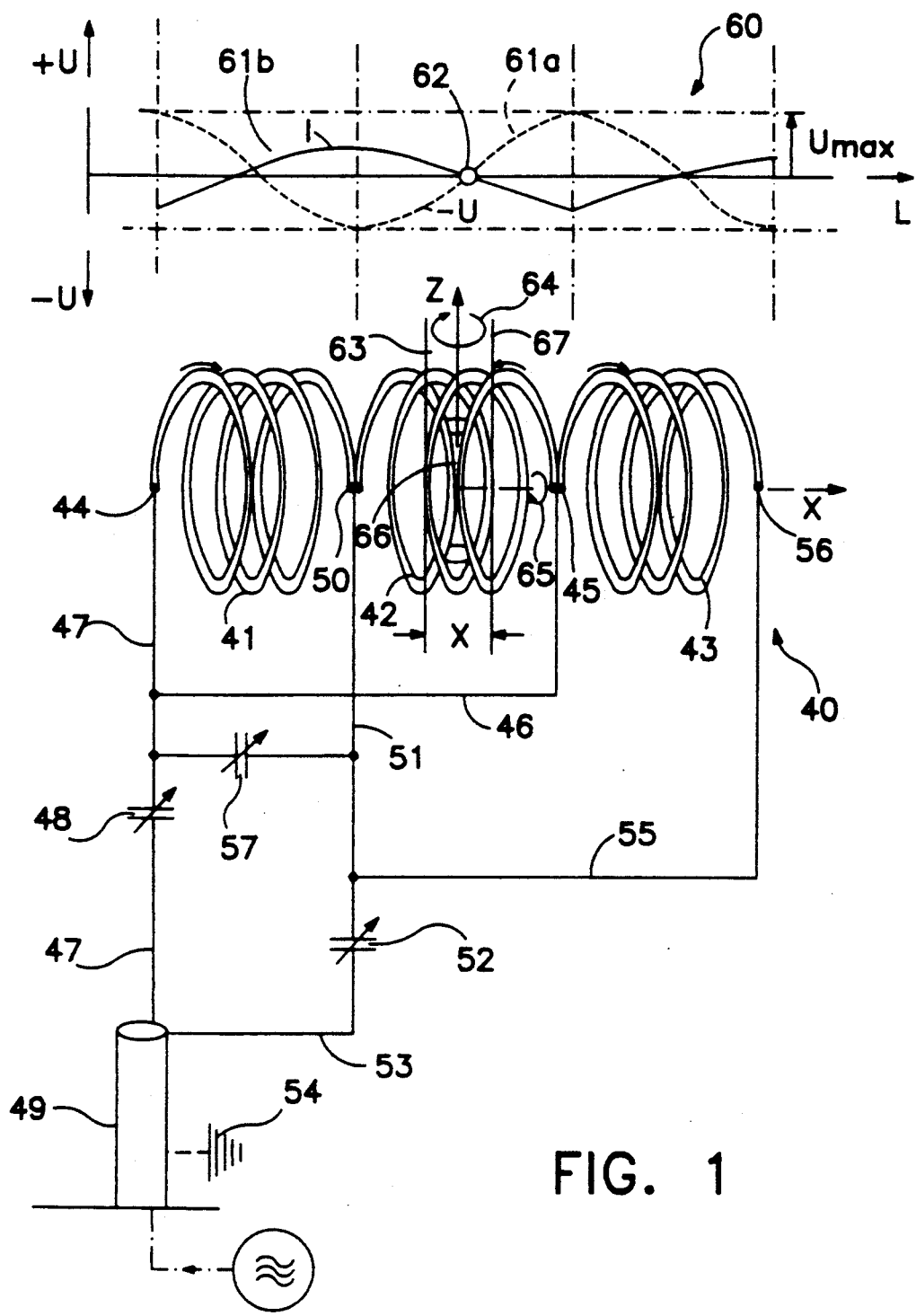
FIG. 1 shows a first embodiment of a probehead according to this invention having three sub-coils.

In FIG. 1, reference numeral 40 as a whole indicates a probehead of a nuclear magnetic resonance spectrometer, not shown in the drawings for the sake of simplicity. However, the nuclear magnetic resonance spectrometer, as can be used in conjunction with the present invention, is of conventional design as known to a person of ordinary skill. Nuclear magnetic resonance spectrometers, as generally known, comprise a magnet system for generating a constant magnetic field of high intensity and high homogeneity. A probehead is arranged within the constant magnetic field, the probehead, in turn, comprising a coil structure for receiving a sample under investigation. The coil structure is used for generating a high-frequency magnetic field, being directed perpendicularly to the direction of the constant magnetic field. Under special circumstances, the sample under investigation may also be situated within a non-homogeneous area of the high magnetic field.

In nuclear magnetic resonance spectrometers, the coil structure is connected to a transmitter/receiver which, on the one hand, generates a high-frequency signal for feeding the coil structure and, on the other hand, is used as a receiver coil for receiving signals from the sample under investigation and for processing same.

The coil structure consists of three sub-coils 41, 42, and 43. The lefthand terminal of first sub-coil 41 is designated at 44. 45 designates a central point between sub-coils 42 and 43. Electrical lines 46 and 47 interconnect the two aforementioned points 44 and 45. Electric line 47, starting from point 44, extends to a capacitor 48 and, further, to a central conductor of a coaxial cable 49. A central point 50 between first sub-coil 41 and second sub-coil 42 is connected with a capacitor 52 via an electric line 51. An electric line 53 interconnects capacitor 52 and ground 54, being preferably the outer connector of coaxial cable 49. An outer terminal 56 of third sub-coil 43 is connected with central point 50 between first sub-coil 41 and second sub-coil 42 via an electric line 55. Finally, a capacitor 57 is switched between electric lines 47 and 51.

Capacitors 48, 52, and 57 are preferably made adjustable.

As indicated by arrows above sub-coils 41, 42, and 43, respectively adjacent sub-coils 41/42 and 42/43 are wound in opposite winding senses. All three sub-coils 41, 42, and 43 are arranged adjacent to each other along a common x which, in turn, extends perpendicularly to an axis z, being the axis of the high magnetic field.

As can be taken from the foregoing description of the circuit of FIG. 1, sub-coils 41, 42, and 43 are switched in parallel.

Adjusting capacitors 48, 52, and 47 allows to match probehead 40 to the transmitter/receiver by adjusting capacitors 48 and 52. Simultaneously, the coil structure may be made symmetric. Adjustable capacitor 57 allows to tune the entire circuit with respect to its resonance frequency.

As can be taken from a diagram 60 in FIG. 1, a graph 61a of high-frequency voltage U and a graph 61b of high-frequency current I are such that voltage graph 61a has a positive maximum value $U_{max}$ at terminals 44 and 45 and has an equal negative maximum value at terminals 50 and 56. Current graph 61b, in turn, has a maximum value in the center of any of sub-coils 41, 42, or 43.

Considering now the coil structure under geometric aspects, it becomes apparent that the geometric center of the coil structure of FIG. 1, being the center of sub-coil 42, corresponds to a zero transition 62 in voltage graph 61a.

One can now define a spatial area 63 within the center sub-coil 42 around zero transition 62, within which high-frequency voltage U and the corresponding high-frequency electrical field intensity do not exceed a predetermined threshold value.

It is possible to arrange a sample holder within area 63 for receiving a sample 66 as schematically shown in FIG. 1. The sample holder, being not particularly depicted in FIG. 1 for the sake of simplicity, is then situated at an area of low voltage U and, respectively, of low electric field. Considering that neither substantial electrical losses or voltage discharges may occur, the sample holder may be designed in a relatively complicated way. It is, therefore, possible to provide a sample holder allowing to rotate sample 66 along an arrow 64 about axis z of the constant magnetic field. However, one can also rotate sample 66 about common axis x of the coil structure, as indicated by arrow 65. Moreover, rotation about other axes are possible, e.g. about an axis being inclined by the so-called "magic angle" of 54.7° with respect to axis z of the constant magnetic field.

In FIG. 1, 67 indicates that a sample feed structure may be used for transporting samples 60 to the sample head or for removing same therefrom. The sample feed structure may, concurrently, serve as a sample rotation unit.

Figure 2:
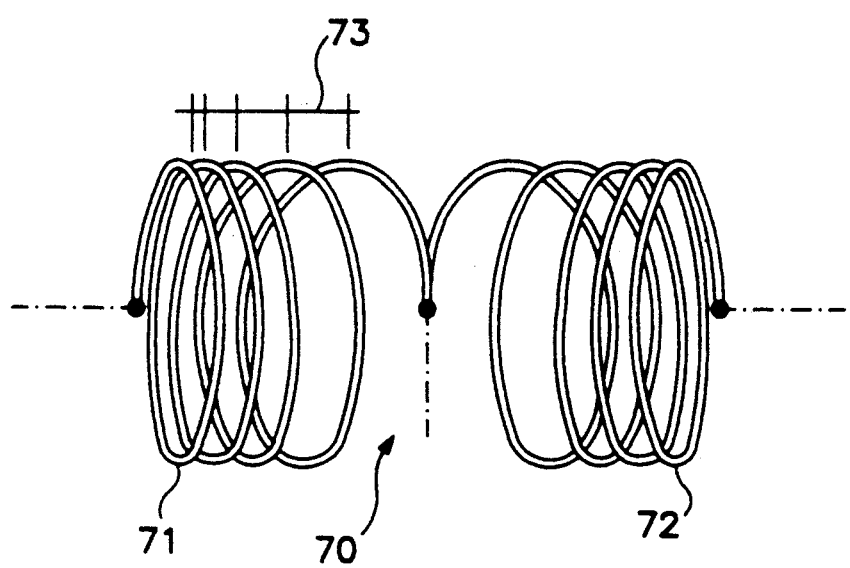
FIG. 2 shows a second embodiment of a probehead according to the invention, similar to that of FIG. 1.

In FIG. 2, still another embodiment of the inventive probehead is designated by 70. Probehead 70, similarly as the probehead shown in FIG. 1, comprises a first sub-coil 71, a second sub-coil 72, and a third sub-coil not shown. In contrast to the probehead of FIG. 1, sub-coils 71 and 72 are designed such that the distance 73 between coil windings decreases from the center point between sub-coils 71 and 72, as can clearly be seen.

In such a way, the homogeneity of the high-frequency magnetic field may be improved, because the magnetic field decrease at the coil terminals is compensated for. If this is done, the partial inductances of the sub-coils, as taken per se, becomes slightly difference, however, the entire system is only influenced to a negligible extent.

As already mentioned above, the probeheads according to the invention may be used for solid state imaging processes. In such processes, the sample is situated within a well-defined non-homogeneous magnetic field having a field gradient being particularly strong along the direction of the strong magnetic field. In order to make a slice selection within the sample, the entire arrangement may be displaced along the direction of the constant magnetic field lines. By rotating the sample about one or two axes perpendicular to the main field axis, the desired projection is generated.

In a practical embodiment, the probeheads 40 and 70, respectively, of FIGS. 1 and 2, respectively, may be designed for an operating frequency of 160 MHz, for performing measurements on 30 mm diameter samples. Sub-coils 41, 42, 43 may, e.g., have four windings each.

It is particularly preferred to use the probeheads 40 and 70, respectively, according to this invention, for performing three-dimensional measurements on solid-state samples, e.g. performing volume-selective measurements on integrated electronic circuits.

Although a particular embodiment of the invention has been described in detail for purposes of illustration, various modifications may be made without departing from the spirit and scope of the invention.

What is claimed is:

1. A probehead for a nuclear magnetic resonance spectrometer, comprising:
   a coil structure defining a first axis and having
      a first solenoid coil having a first terminal and a second terminal, and being wound in a first winding sense about said first axis;
      a second solenoid coil adjacent said first solenoid coil and having a third terminal and a fourth terminal, and being wound in a second winding sense opposite said first winding sense about said first axis, said third terminal of said second solenoid coil being connected to said second terminal of said first solenoid coil in a first junction point, said second solenoid coil being, further, arranged symmetrically with respect to a central point of said first axis;
      a third solenoid coil adjacent said second solenoid coil and having a fifth terminal and a sixth terminal, and being wound in said first winding sense about said first axis, said fifth terminal of said third solenoid coil being connected to said fourth terminal of said second coil in a second junction point;
   high-frequency signal supply means having a high-frequency terminal and a ground terminal;
   a first capacitor;
   a first electrical line interconnecting said high-frequency terminal with a first electrode of said first capacitor;
   a second electrical line interconnecting said first terminal of said first solenoid coil with a second electrode of said first capacitor;
   a third electrical line interconnecting said first terminal of said first solenoid coil with said second junction point between said second and said third solenoid coils;
   a second capacitor;
   a fourth electrical line interconnecting said ground terminal with a first electrode of said second capacitor;

a fifth electrical line interconnecting said sixth terminal of said third solenoid coil with a second electrode of said second capacitor;

a sixth electrical line interconnecting said sixth terminal of said third solenoid coil with said first junction point between said first and said second solenoid coils;

sample supporting means arranged at said central point within said second solenoid coil.

2. The probehead of claim 1, wherein said sample support means are connected to sample feed means arranged for transporting samples to said sample support means for removing same therefrom.

3. The probehead of claim 1, wherein said first capacitor is made adjustable.

4. The probehead of claim 1, wherein said second capacitor is made adjustable.

5. The probehead of claim 1, wherein a third capacitor is switched between said second electrodes of said first and said second capacitors.

6. The probehead of claim 5, wherein said third capacitor is made adjustable.

7. The probehead of claim 1, wherein said first, said second and said third solenoid coils have a pitch varying along said axis.

8. The probehead of claim 1, wherein said sample support means are arranged for rotating said sample.

9. The probehead of claim 8, wherein said sample is rotated about said first axis.

10. The probehead of claim 8, wherein aid sample is rotated about a second axis extending perpendicularly to said first axis.

11. The probehead of claim 8, wherein said sample is rotated about a third axis extending under a magic angle with respect to said first axis.

12. The probehead of claim 1, wherein displacement means are provided for displacing said coil structure along a direction extending perpendicularly to said first axis.

* * * * *